United States Patent
Miyajima et al.

(10) Patent No.: US 7,212,277 B2
(45) Date of Patent: May 1, 2007

(54) SUBSTRATE HOLDING TECHNIQUE

(75) Inventors: Yoshikazu Miyajima, Utsunomiya (JP); Hideo Tanaka, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 191 days.

(21) Appl. No.: 10/941,962

(22) Filed: Sep. 16, 2004

(65) Prior Publication Data
US 2005/0093666 A1    May 5, 2005

(30) Foreign Application Priority Data
Sep. 17, 2003    (JP)    ............... 2003-324214

(51) Int. Cl.
G03B 27/62 (2006.01)
G03B 27/58 (2006.01)
H01F 7/20 (2006.01)

(52) U.S. Cl. ............... 355/75; 355/72; 269/8; 335/286; 335/289; 335/290

(58) Field of Classification Search ............ 355/72–76, 355/286, 289, 290; 269/8
See application file for complete search history.

(56) References Cited

U.S. PATENT DOCUMENTS

| 6,266,133 B1 | 7/2001 | Miyajima et al. ............. 355/72 |
| 6,320,649 B1 | 11/2001 | Miyajima et al. ............. 355/72 |
| 6,323,935 B1 * | 11/2001 | Ebihara et al. ............... 355/53 |
| 6,583,859 B2 | 6/2003 | Miyajima et al. ............. 355/72 |
| 2003/0040831 A1 | 2/2003 | Tanaka et al. ............. 700/121 |

FOREIGN PATENT DOCUMENTS

| JP | 11-288099 | 10/1999 |
| JP | 3076727 | 6/2000 |
| JP | 2003-142393 | 5/2003 |

* cited by examiner

*Primary Examiner*—Ramon M. Barrera
(74) *Attorney, Agent, or Firm*—Fitzpatrick, Cella, Harper & Scinto

(57) ABSTRACT

An object holding apparatus including a chuck for holding an object, a holder configured to hold the chuck, a generator provided in the holder and configured to generate a field related to an attraction force, a member provided in the chuck and configured to be attracted by the generator in accordance with the field, and a support configured to support one of the generator and the member. The support is configured to allow the one to move toward the other and away from the other, and the support includes a leaf spring.

12 Claims, 7 Drawing Sheets

SUBSTRATE HOLDING TECHNIQUE

FIELD OF THE INVENTION AND RELATED ART

This invention relates generally to technology for holding a thin plate-like substrate, such as a reticle or a silicon wafer, for example, in a semiconductor manufacturing procedure or any other precision microprocessing in procedures, for example.

As a projection exposure apparatus for projecting and transferring a reticle pattern onto a silicon wafer, there is an EUV (extreme ultraviolet) exposure apparatus that uses, as a light source, exposure light having a wavelength of about 13–14 nm (extreme ultraviolet light) and that is arranged to project and to photoprint a reticle pattern onto a silicon wafer in a vacuum environment and through a mirror optical system.

Referring to FIG. 8, such an EUV exposure light source will be explained in detail. Denoted in the drawing at 101 is a mirror reduction optical system (projection optics), and a plurality of reflection mirrors are disposed and supported precisely inside this projection optical system 101.

The projection optical system 101 is supported by a projection optical system base table 106, and this base table 106 is supported by means of a supporting mechanism 108. The supporting mechanism 108 comprises an anti-vibration table that supports the weight thereof while suppressing external vibration applied to the projection optical system base table 106, and a metal bellows (not shown). It is arranged so that, when the load of a structure inside a vacuum chamber 107 (i.e., projection optical system 101 and base table 106) is supported from outside the chamber 107, the vacuum level inside the vacuum chamber can be maintained while, on the other hand, any positional deviation between the vacuum chamber and the thus prepared structure can be resiliently absorbed.

There is a mask (original) 103 above the projection optical system 101, and the entire bottom face of the mask 103 is held by means of a mask chuck 115. The mask chuck 115 is mounted to a mask stage 102 above the mask stage 102. The mask 102 stage can be driven by means of an actuator (not shown) for repeated scan exposure of the mask 103 pattern. Denoted in the drawing at 104 is a portion of a mask stage measurement light, taking the projection optical system base table 106 as the reference measurement. In the exposure apparatus of FIG. 8, the position of the mask stage 102 is measured with respect to multiple axes, by means of interferometers using laser light, and the mask stage 102 is positioned on the basis of the measurement. Disposed above the mask stage 102 is a mask stage guide 113 that guides the mask stage 102 for multiple-axis motions. The mask stage guide 113 is supported by a mask stage damper base table 114.

Disposed below the projection optical system 101 is a wafer stage 109 being movable while holding a wafer (substrate to be exposed) 105. Denoted at 110 is a portion of a wafer stage measurement light, taking the projection optical system base table 106 as the reference of measurement, as with the mask stage 102. The position of the wafer stage 109 is measured with respect to multiple axes, by means of interferometers using laser light, and the wafer stage 109 is positioned on the basis of the measurement.

Disposed below the wafer stage 109 is a wafer stage guide 111 that guides the wafer stage 109 for multiple-axis motions. As regards the guiding method, a static pressure arranged for use in a vacuum may be used, for example. The wafer stage guide 111 is supported by a wafer stage damper base table 112, which is arranged to support the flatness of the guiding surface of the wafer stage guide 111 very precisely. The wafer stage damper base table 112 is supported by an anti-vibration table or the floor on which the apparatus is mounted.

In an exposure operation, EUV light projected from an illumination system (not shown) is reflected by the exposure pattern surface of the mask 103 and then is reflected along an optical path (not shown) inside the projection optical system 101, whereby it is projected upon the silicon wafer 105. While the wafer 105 is held by the wafer stage 109, the wafer stage 109 and the mask 102, having a mask 3 mounted thereon, are measured with respect to multiple axes by using laser light and then they are positioned. Then, the wafer 105 and the mask 103 are scanningly moved in synchronism with each other or, alternatively, one of them is held stationary and sequential exposure is carried out. As regards the position of the mask stage 102, as an example, the position in a vertical direction (Z direction) of the mask reflection surface, the position with respect to the two orthogonal directions (X and Y directions) along a plane (X-Y plane) perpendicular to that vertical direction, and rotations about the three orthogonal axes (X, Y and Z axes), may be measured.

FIG. 9 is an enlarged view of the mask chuck 115 and the mask stage 102 described above. There is a possibility that a foreign particle, such as at 116, is sandwiched between the chucking surface of the mask chuck 115 and the mask 103, and the foreign particle adversely influences the flatness of the mask 103. In consideration of this, the mask chuck 115 is demountably mounted to the mask stage 102, and the cleaning operation for the mask chuck 115 is carried out outside the vacuum chamber 107.

As a fixing device for attracting and holding a thin plate-like member in a vacuum environment, Japanese Patent No. 3076727 discloses a technique according to which electrostatic attracting means arranged to attract and to hold upon a stage and through an electrostatic force, an electrically conductive cassette for holding a sample, such as a glass mask or a wafer, provided for electron beam irradiation, is mounted to the stage. Also, as an exposure apparatus in which a wafer is held fixed, Japanese Laid-Open Patent Application, Publication No. 2003-142393, discloses a technique according to which a pallet has a wafer electrostatic chuck for fixing a wafer. Further, as an exposure apparatus having a mask holding member for mountably and demountably holding an exposure mask, Japanese Laid-Open Patent Application, Publication No. 11-288099, discloses a technique according to which an exposure mask is positioned by manually pressing the mask against a positioning pin of a mask holding member and, in this state, the mask is held by a toggle clamp.

In a mechanism for demounting and clearing a mask chuck, chucking (attracting and holding) the mask chuck from the stage causes degradation of the mask chuck flatness. Also, a positional deviation of the mask chuck with respect to the mask stage leads to degradation of the mask holding precision. Moreover, an electricity supplying system for mounting and demounting a mask to and from the mask chuck has a complicated structure.

SUMMARY OF THE INVENTION

It is accordingly an object of the present invention to provide a substrate holding technique by which a substrate can be held at a high surface precision, in a vacuum environment.

In accordance with an aspect of the present invention, there is provided an object holding apparatus, comprising a chuck for holding an object, a holding unit for holding the chuck, a generating unit provided in the holding unit, for generating a field related to an attraction force, a member provided in the chuck and attracted by the generating unit in accordance with the field, and a supporting unit for supporting one of the generating unit and the member, for movement at least in a direction nearing the other and in a direction away from the other.

In accordance with another aspect of the present invention, there is provided an object holding apparatus, comprising a chuck for holding an object, a holding unit for holding the chuck, and a measuring unit for measuring relative displacement between the chuck and the holding unit.

In accordance with a further aspect of the present invention, there is provided an object holding apparatus, comprising a chuck for holding an object, and a holding unit for holding the chuck, wherein the chuck includes a first electrode for attracting the object with an electrostatic force and a second electrode for attracting the holding unit with an electrostatic force.

Thus, the present invention can provide a unique and useful substrate holding technology for holding a substrate at a high surface precision.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

Embodiment 1

Figure 1:
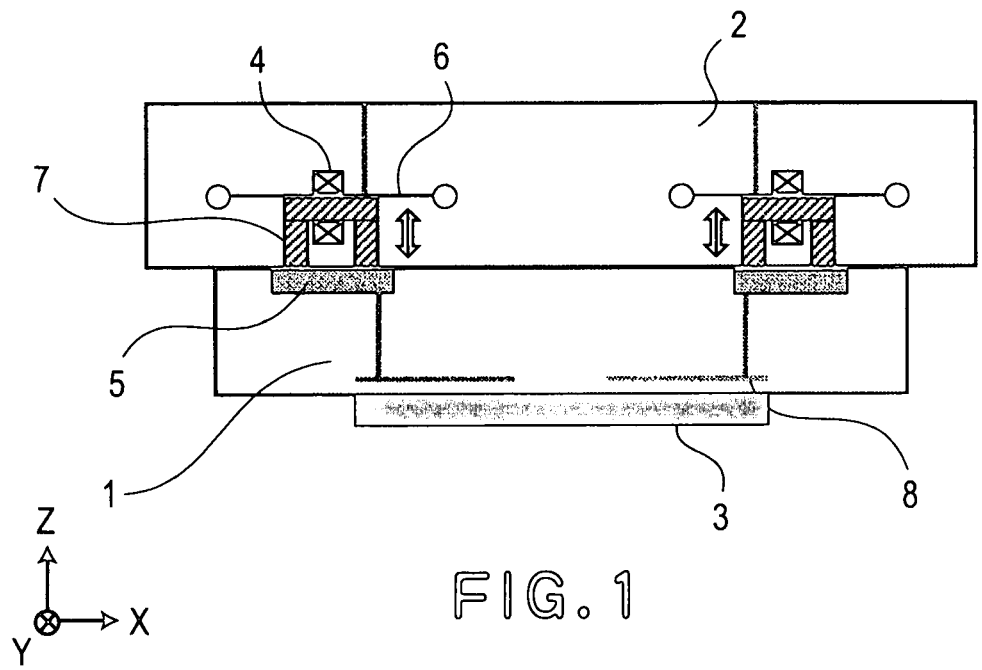
FIG. 1 is a schematic view of attracting means in a first embodiment of the present invention.
Figure 2:
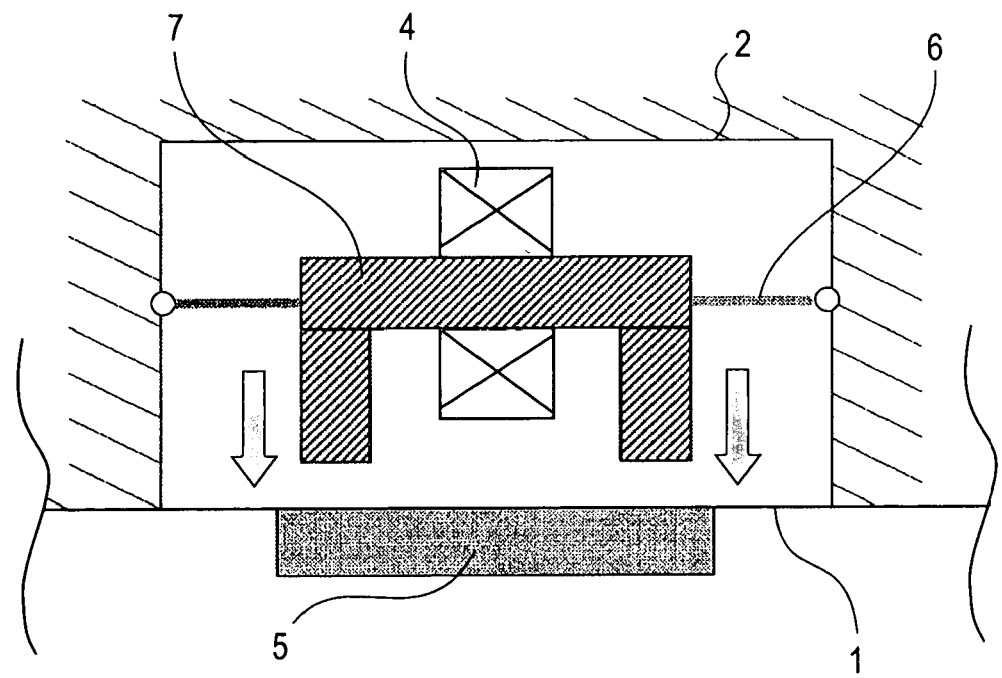
FIG. 2 is a fragmentary and an enlarged view of the attracting means of FIG. 1.
Figure 8:
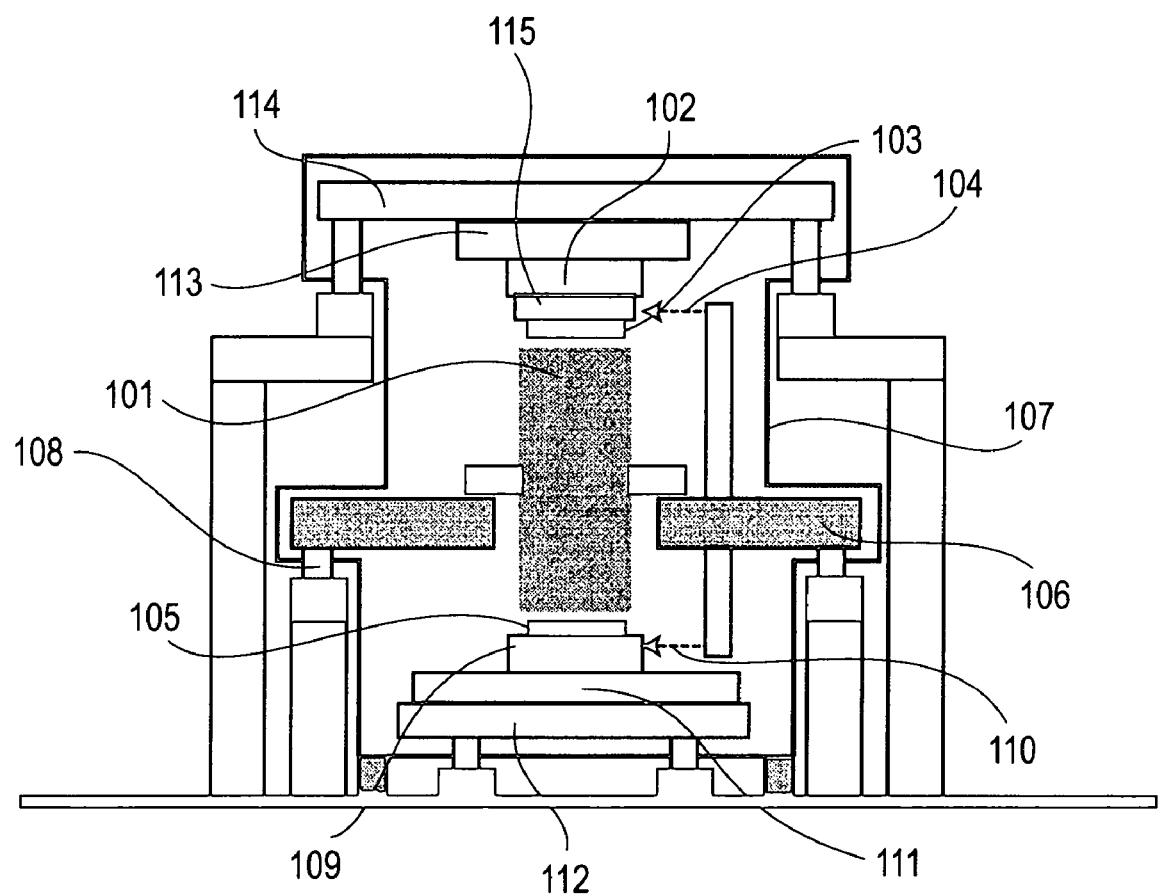
FIG. 8 is a schematic view of an exposure apparatus.
Figure 9:
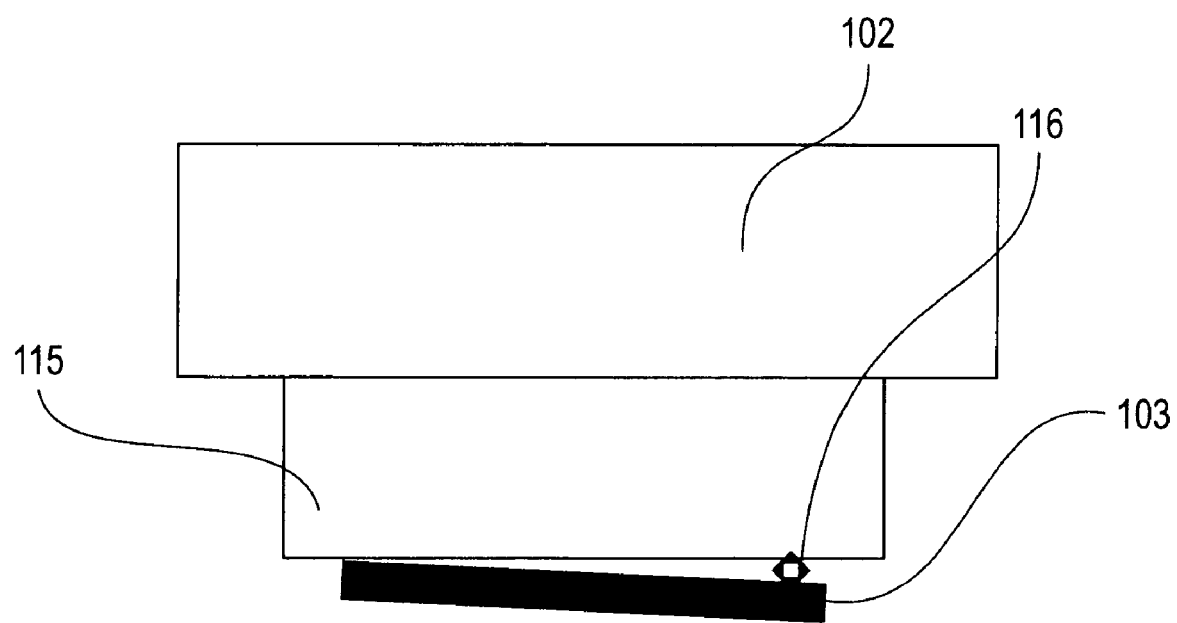
FIG. 9 is an enlarged view of a mask stage and a mask chuck having a mask mounted thereon.

A first embodiment of the present invention will be described with reference to FIGS. 1 and 2. FIGS. 1 and 2 illustrate, in enlarged magnification, a mask stage and a mask chuck portion, disposed above a projection optical system of an exposure apparatus, such as shown in FIG. 8. In FIG. 1, denoted at 1 is a mask chuck (substrate holding member), and denoted at 2 is a mask stage (stage) movable in a predetermined direction. The mask chuck has targets formed thereon, for measurement of position, angle and focus of the mask stage 2. The scan direction of the mask stage 2 is in the Y-axis direction in FIG. 1. The mask chuck 1 having a mask (substrate) 3 held thereon is mounted to the mask stage 2. The mask chuck 1 and the mask stage 2 are provided with attracting means for mountably and demountably supporting the mask chuck 1 on the mask stage 2. The attracting means comprises a coil iron core 7 (second member) provided at the mask stage 2 side and a ferromagnetic material member (first member) provided at the mask chuck 1 side. In FIG. 1, actually, there are two sets of attracting means disposed along the X direction.

Each coil iron core 7 has an exciting coil 4 wound around the core, and the coil 7 is supported on the mask stage 2 with freedoms in the Z direction, around the Y axis (small freedom) and around the X axis in FIG. 1, by means of a leaf spring (resilient material) 6. In this example, the rigidity of the leaf spring 6 is lower than that of the mask chuck 1. Namely, the leaf spring 6 has a low rigidity only with respect to a vertical direction of the mask reflection surface. The ferromagnetic material member 5 is a plate-like member made of metal, and it is embedded at such a position where the coil iron core 7 can contact thereto against the force of the leaf spring 6, in the manner that the member 5 surface becomes approximately coplanar with the upper surface of the mask chuck 1.

The mounting structure for the coil ion core 7 will be described in greater detail, with reference to FIG. 2. At a nominal position of the leaf spring 6, the coil iron core 7 is placed inwardly, inside the mask stage 2, of the contact surface between the mask stage 2 and the mask chuck 1, that is, the surface of the ferromagnetic material member 5. With this arrangement, the free end face of each leg of the coil iron core 7 can be opposed to the ferromagnetic material member 5 with a clearance. For attraction of the coil iron core 7 and the ferromagnetic material member 5, while the leaf spring 6 deforms, the coil iron core 7 is attracted toward the ferromagnetic material 5 side and is brought into contact with it, whereby the mask chuck 1 is held. In this case, since the leaf spring 6 can absorb displacement, there is no possibility that, due to the surface precision matching between the contact surfaces of the coil iron core 7 and the ferromagnetic material member 5, a force is applied to the mask chuck 1 to cause deformation thereof.

In the attracting means of the first embodiment, the leaf spring 6 is mounted on the coil iron core 7 side to support the same. However, the invention is not limited to this. The leaf spring 6 may be mounted on the ferromagnetic material member 5 side to support the same. It is to be noted here that, regarding the attracting means, there are two sets of attracting means also with respect to the Y-axis direction.

At a lower portion inside the mask chuck 1, opposed to the mask 3, there are two sets of plate-like electrostatic chuck electrodes 8 for holding the mask 3. Each electrostatic chuck electrode 8 is connected to the ferromagnetic material member 5 through a wire or a metal plate, while, on the hand, the coil iron core 7 contacted to the ferromagnetic material member 5 is connected to an electricity supplying unit (not shown) through a wire, or the like. In this example, the contact surface between the coil iron core 7 and the ferromagnetic material member 5, producing an electromagnetic force, is defined or functions as a portion of an electricity supplying path for the electrostatic chuck electrode 8 of the mask chuck 1. In this embodiment, as described above, the contact surface between the coil iron core 7 and the ferromagnetic material member 5 is included in the electricity supplying path for the electrostatic chuck electrode 8. However, the invention is not limited to this. Along a different path, electricity can be supplied to the electrostatic chuck electrode 8. Furthermore, in this embodiment, the contact surface that produces an electromagnetic force functions as a heat transfer path for cooling the mask chuck 1 and the mask 3. In this case, any heat produced can flow from the contact surface to the coil iron core and the wire, for example, and is heat-exchanged. If the contact surface between the coil iron core 7 and the ferromagnetic material member 5 is not used as the electricity supplying path, as the ferromagnetic material member 5, a material having a low electrical conductivity, such as ferrite, may be used.

In the first embodiment, for holding of the mask chuck 1 by the mask stage 2, the exciting coil 4 is energized and, in response, a magnetic field is produced from the coil iron core 7 by which the ferromagnetic material member 5 embedded in the mask chuck 1 is magnetized and whereby the mask chuck 1 is attracted. After the attraction and even after the voltage supply to the exciting coil 4 is discontinued, since the ferromagnetic material member 5 has already been magnetized, the coil iron core 7 and the ferromagnetic material member 5 are mutually attracted to each other, such that the mask chuck 1 can be continuously held on the mask stage 2. For demounting the mask chuck 1 from the mask stage 2, an electrical current is applied in an opposite direction to the exciting coil 4 and, thus, an opposing magnetic field is applied to the ferromagnetic material member 5, whereby it is demagnetized. Further, when the coil iron core 7 and the ferromagnetic material member 5 are attracted to each other, owing to the electricity supplying path extending through the contact surface therebetween producing an electromagnetic force, an electrical potential is applied to the two, left-hand side and right-hand side electrostatic chuck electrodes 8. By means of electrical charges on that occasion, the mask chuck 1 can electrostatically attract approximately the entire surface of the mask bottom face and hold the same tightly.

Embodiment 2

Figure 3:
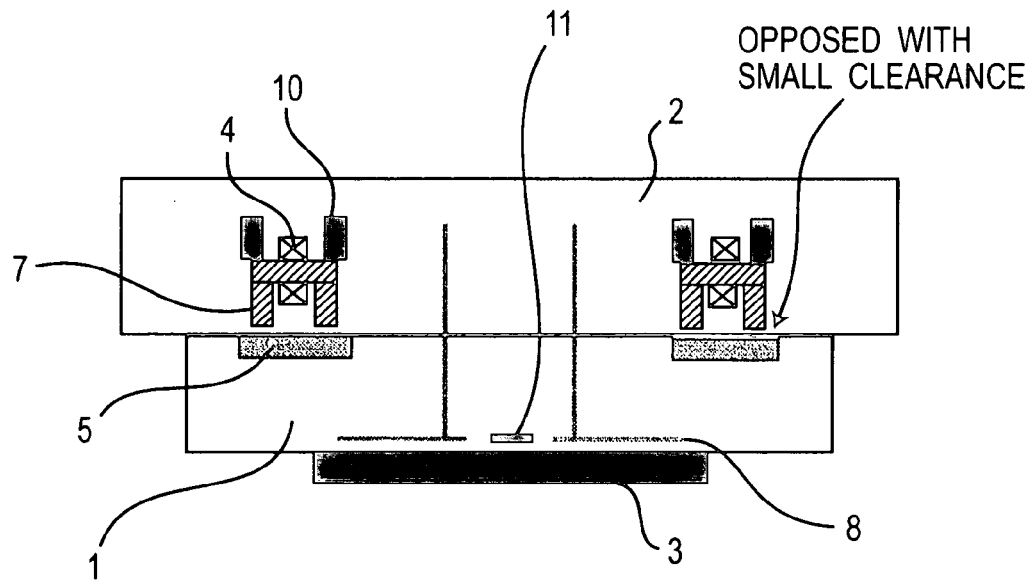
FIG. 3 is a schematic view of attracting means in a second embodiment of the present invention.

A second embodiment of the present invention will be described with reference to FIG. 3. In FIG. 3, like reference numerals are assigned to components corresponding to those of the FIG. 1 embodiment, and a description thereof will be omitted. Only the distinctive features will be explained.

In the second embodiment, the second member at the mask stage 2 side (i.e., coil iron core 7) and the first member at the mask chuck 1 side (i.e., ferromagnetic material member 5) are disposed close to each other with a clearance, as with the structure shown in FIG. 2. By disposing the coil iron core 7 and the ferromagnetic material member 5 to be opposed to each other with a clearance as described above, unwanted deformation of the mask chuck 1 due to their mutual surface precision can be avoided. Furthermore, each coil iron core 7 is provided with a piezoelectric actuator 10 or, alternatively, a distance adjusting mechanism (not shown), such that the flatness of the mask chuck 1 can be corrected thereby.

For the flatness correction, the gap distance (clearance) between the coil iron core 7 and the ferromagnetic material member 5 may be adjusted by means of the piezoelectric actuator 10, or the like, while the flatness is measured by using an external interferometer or any other measuring device. As an alternative, distortion sensors 11 may be embedded in the mask chuck 1, at plural locations, and the adjustment may be done while measuring the surface shape by use of these distortion sensors 11. As for such an adjustment, measurement and adjustment may be done at the start of the exposure apparatus, for example, or it may be made in various ways. It should be noted that, to each electrostatic chuck electrode 8, an electricity supplying path, such as a wire or a metal plate, for example, is connected, and this electricity supplying path is in turn connected to an electricity supplying unit, not shown. In this case, the contact between the mask chuck 1 and the mask stage 2 in the electricity supplying path is accomplished by means of a brush member, for example, which is provided on at least one of or each of the mask chuck 1 side and the mask stage 2 side. The attraction of the mask 3 is similar to that of the first embodiment. In this case, by means of the electrostatic chuck electrodes 8, approximately the whole surface of the mask 3 bottom face can be held tightly.

Embodiment 3

Figure 4:
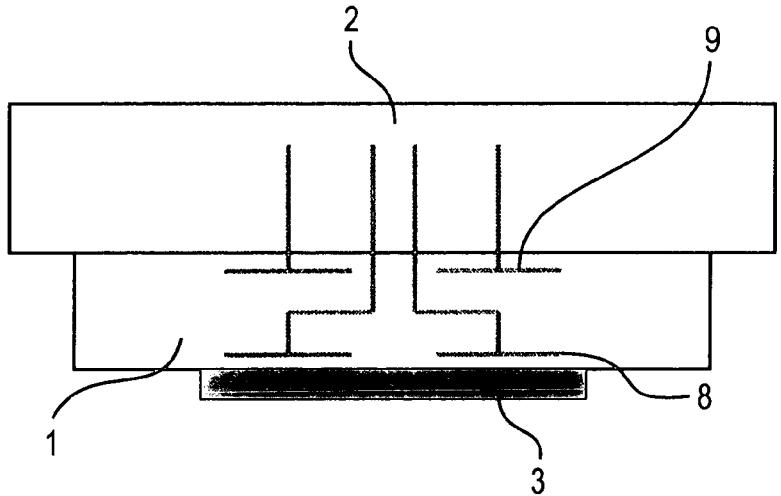
FIG. 4 is a schematic view of attracting means in a third embodiment of the present invention.

A third embodiment of the present invention will be described with reference to FIG. 4. In FIG. 4, like reference numerals are assigned to components corresponding to those of the embodiments of FIGS. 1–3, and a description thereof will be omitted. Only the distinctive features will be explained.

In the third embodiment, in order that a mask chuck 1 is held on a mask stage 3 by an electrostatic attraction force, mask-chuck electrostatic chuck electrodes (electrostatic attracting means) 9 are provided above the mask chuck 1. Each electrostatic chuck electrode 8 is connected to an electricity supplying unit (not shown) through an electricity supplying path, such as wire or a metal plate, for example. In this example, a connecting member, such as a brush, for example, is used at the connection of the electricity supplying path, between the mask chuck 1 and the mask stage 2. With this structure, when the mask chuck 1 is mounted to the mask stage 2, from an electricity supplying unit (not shown), an electrical potential is applied to the mask-chuck electrostatic chuck electrodes 9 and, in response to the application, the mask chuck 1 itself is attracted to the mask stage 2 by an electrostatic attraction force, and it is held thereby. Since a high-precision flat plane is obtainable with an electrostatic chuck (attraction by an electrostatic attraction force), application of unwanted deformation to the mask chuck 1 can be avoided assuredly. As an alternative, the electrostatic chuck electrodes 9 may be provided on the mask stage 2 side to attract and to hold the mask chuck 1. The attraction of the mask 3 is similar to that of the first embodiment. Also, in this case, approximately the entire surface of the mask 3 bottom face can be attracted and held tightly, by means of the electrostatic chuck electrodes 8.

Embodiment 4

Figure 5:
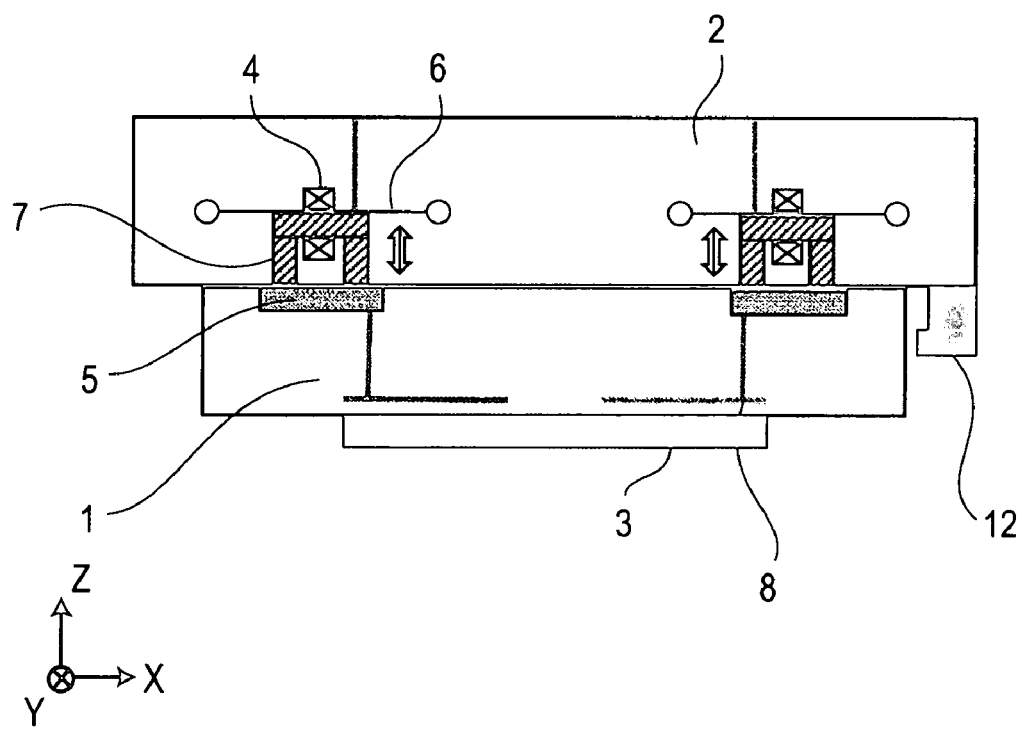
FIG. 5 is a schematic view of a fourth embodiment of the present invention, wherein a mask stage having attracting means is provided with a sensor.

A fourth embodiment of the present invention will be described with reference to FIG. 5. In FIG. 5, like reference numerals are assigned to components corresponding to those of the embodiments of FIGS. 1–4, and a description thereof will be omitted. Only the distinctive features will be explained.

In the fourth embodiment, at the bottom surface portion of the mask stage 2, avoiding the mask chuck 1, a chuck position measuring device (interferometer) 12, which is a displacement measuring sensor for detecting any positional deviation between the mask stage 2 and the mask chuck 1, is provided. In case a positional deviation occurs between the mask stage 2 and the mask chuck 1, the exposure sequence is stopped and alignment of the mask 3 is carried out again.

In the fourth embodiment, the chuck position measuring device 12 is provided on the mask stage 2 of the first embodiment (FIG. 1). However, the invention is not limited to this. Rather, the chuck position measuring device 12 may be mounted to the mask stage 2 of the second embodiment or of the third embodiment. Further, in place of the mechanism for measuring a relative displacement, from the mask stage 2 side, a mask stage measurement reference may be used and displacement of the mask chuck 1 may be measured directly.

When a stage system such as described above is used as a mask stage of a projection exposure apparatus, such as shown in FIG. 8, when the mask chuck is chucked, deformation of the mask chuck resulting from the surface shape of the contact area, including a foreign particle, if any, can be prevented effectively and, in turn, the surface precision of the mask, as well as the performance of the apparatus, can be improved significantly.

Although, in the foregoing description, the invention has been described with reference to embodiments wherein it is applied to a mask stage system, the present invention is also applicable to a wafer stage system, as a matter of course.

Embodiment 5

Next, an embodiment of a device manufacturing method, which uses an exposure apparatus such as described above, will be explained.

Figure 6:
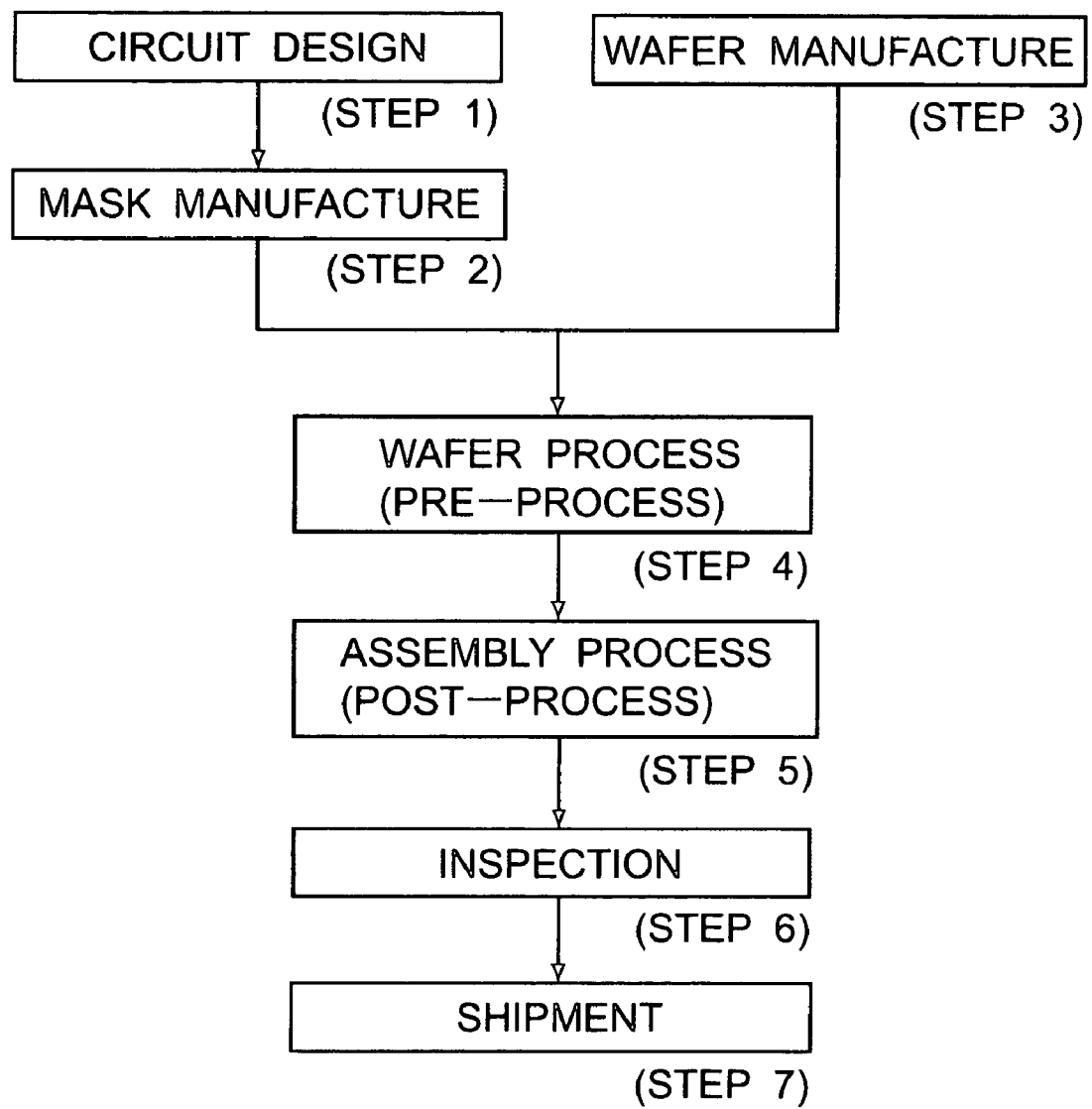
FIG. 6 is a flow chart for explaining the sequence of device manufacture.

FIG. 6 is a flow chart for explaining the procedure of manufacturing various microdevices, such as semiconductor chips (e.g., ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the thus prepared mask and wafer, a circuit is formed on the wafer in practice, in accordance with lithography. Step 5, subsequent to this, is an assembling step, which is called a post-process, wherein the wafer having been processed at step 4 is formed into semiconductor chips. This step includes an assembling (dicing and bonding) process and a packaging (chip sealing) process. Step 6 is an inspection step, wherein an operation check, a durability check, and so on, for the semiconductor devices produced by step 5, are carried out. With these processes, semiconductor devices are produced, and they are shipped (step 7).

Figure 7:
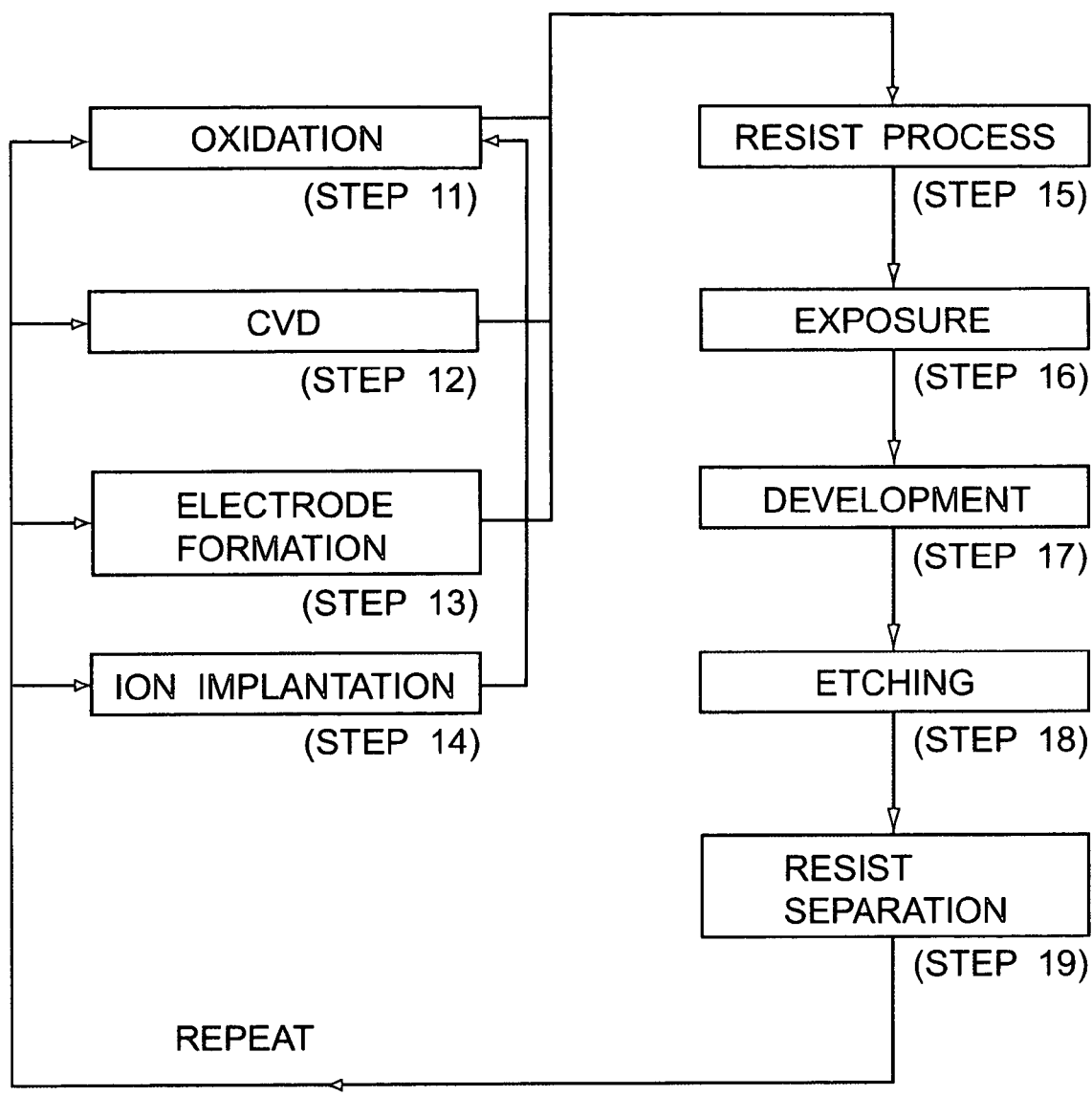
FIG. 7 is a flow chart for explaining, in detail, a wafer process in the procedure of FIG. 6.

FIG. 7 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions on the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

Although some preferred embodiments of the present invention have been described in the foregoing, the present invention, in different aspects, can be embodied as follows.

(1) In an exposure apparatus wherein a pattern formed on an original is projected, in a vacuum environment, onto an exposure substrate to be exposed, through a projection optical system, wherein, while moving both of the original and the exposure substrate or only the exposure substrate relative to the projection optical system by use of a stage system, the pattern of the original is repeatedly photoprinted on the exposure substrate, characterized by an original mounting and holding member for mounting the original to the stage system, wherein at least one of attracting and holding means provided at the original mounting and holding member side and attracting and holding means provided at the stage system side is mounted through a resilient member having a rigidity lower than that of the original mounting and holding member.

(2) In an exposure apparatus according to Item (1) above, the resilient member is a resiliency member having a low rigidity only in a vertical direction to the mask reflection surface.

(3) In an exposure apparatus according to Item (1) or (2) above, attracting and holding means having a clearance is provided between the original attracting and holding member and the attracting and holding means at the stage system side, wherein the flatness of the original mounting and holding member is measured and the clearance distances at plural locations of the attracting and holding means are adjusted.

(4) In an exposure apparatus according to Item (3) above, measuring means for measuring the surface precision of the original mounting and holding member uses a distortion sensor.

(5) In an exposure apparatus according to Item (4) above, the clearance distance between a ferromagnetic material member and a coil iron core is controlled by means of an actuator and on the basis of an output value of the distortion sensor or on the basis of the pre-measured value.

(6) In an exposure apparatus according to any one of Items (1) to (5), the attracting mechanism of the attracting and holding means uses an electromagnetic force or an electrostatic attraction force.

(7) In an exposure apparatus according to any one of Items (1)–(6), a displacement measuring sensor is provided between the original mounting and holding member and the stage system.

(8) In an exposure apparatus according to any one of Items (1)–(7), the original mounting and holding member is provided with a target for measurement of position, angle or focus of the stage system.

(9) In an exposure apparatus according to any one of Items (1)–(8), the contact surface for generating an electromagnetic force functions as an electricity supplying path to the original mounting and holding member.

(10) In an exposure apparatus according to any one of Items (1)–(9), the contact surface for generating an electromagnetic force functions as a heat transfer path for cooling the original mounting and holding member and the mask.

(11) A device manufacturing method characterized by manufacturing a device by use of an exposure apparatus as recited in any one of Items (1)–(10).

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2003-324214 filed Sep. 17, 2003, which is hereby incorporated by reference.

What is claimed is:

1. An object holding apparatus, comprising:
    a chuck configured to hold an object;
    a holder configured to hold said chuck;
    a generator provided in said holder and configured to generate a field related to an attraction force;
    a member provided in said chuck and configured to be attracted by said generator in accordance with the field; and
    a support configured to support one of said generator and said member, said support being configured to allow said one of said generator and said member to move toward the other of said generator and said member and away from the other of said generator and said member,
    wherein said support includes a leaf spring.

2. An apparatus according to claim 1, wherein said generator is configured to generate a magnetic field.

3. An apparatus according to claim 2, wherein said generator includes a core and a coil configured and positioned to energize said core.

4. An apparatus according to claim 2, wherein said member includes a magnetic material.

5. An apparatus according to claim 2, wherein said support includes a member having a rigidity lower than that of said chuck, with respect to a direction along which said support allows said one of said generator and said member to move.

6. An apparatus according to claim 2, wherein said apparatus is configured so that said generator and said member are brought into contact with each other by the attraction force.

7. An apparatus according to claim 6, wherein said apparatus is configured so that a heat path between said chuck and said holder is defined by the contact.

8. An exposure apparatus for exposing a substrate to light via an original, said apparatus comprising:
    an object holding apparatus as defined in claim 1 for holding the original.

9. A method of manufacturing a device, said method comprising:
    exposing a substrate to light via an original using an exposure apparatus as defined in claim 8;
    developing the exposed substrate; and
    processing the developed substrate to manufacture the device.

10. An object holding apparatus, comprising:
    a chuck configured to hold an object;
    a holder configured to hold said chuck;
    a generator provided in said holder and configured to generate a field related to an attraction force;
    a member provided in said chuck and configured to be attracted by said generator in accordance with the field; and
    a support configured to support one of said generator and said member, said support being configured to allow said one of said generator and said member to move toward the other of said generator and said member and away from the other of said generator and said member,
    wherein said apparatus is configured so that said generator and said member are brought into contact with each other by the attraction force, and said chuck includes a mechanism configured to hold the object, an electricity supplying path to said mechanism being defined by the contact.

11. An exposure apparatus for exposing a substrate to light via an original, said apparatus comprising:
    an object holding apparatus as defined in claim 10 for holding the original.

12. A method of manufacturing a device, said method comprising:
    exposing a substrate to light via an original using an exposure apparatus as defined in claim 11;
    developing the exposed substrate; and
    processing the developed substrate to manufacture the device.

* * * * *